US012804842B2

(12) United States Patent
Lee et al.

(10) Patent No.: US 12,804,842 B2
(45) Date of Patent: Nov. 17, 2026

(54) CURRENT DETECTION DEVICE

(71) Applicant: Fulian Precision Electronics (Tianjin) Co., LTD., Tianjin (CN)

(72) Inventors: Wei-Ming Lee, New Taipei (TW); Chi-Wen Chen, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 162 days.

(21) Appl. No.: 18/941,310

(22) Filed: Nov. 8, 2024

(65) Prior Publication Data

US 2026/0113865 A1 Apr. 23, 2026

(30) Foreign Application Priority Data

Oct. 17, 2024 (CN) ......................... 202411449707.0

(51) Int. Cl.
*H05K 7/14* (2006.01)
*G01R 31/40* (2020.01)

(52) U.S. Cl.
CPC ........... *H05K 7/1498* (2013.01); *G01R 31/40* (2013.01)

(58) Field of Classification Search
None
See application file for complete search history.

(56) References Cited

U.S. PATENT DOCUMENTS

2005/0012496 A1* 1/2005 Taniguchi ............ G01R 31/364 324/117 R
2008/0284614 A1* 11/2008 Perez .................... G01R 22/065 340/870.02
2015/0231975 A1* 8/2015 Ishii ....................... B60L 15/007 307/10.1
2023/0164940 A1* 5/2023 He .......................... B60R 16/03 361/807
2023/0393638 A1* 12/2023 Anderson ............... G06F 1/266
2025/0142792 A1* 5/2025 Sanada .................... H02M 7/48
2025/0147076 A1* 5/2025 Nakayama ............. G01R 15/20

FOREIGN PATENT DOCUMENTS

TW I684770 B 2/2020
WO 2024034163 A1 2/2024

* cited by examiner

*Primary Examiner* — Jas A Sanghera
(74) *Attorney, Agent, or Firm* — ScienBiziP, P.C.

(57) ABSTRACT

A current detection device is provided for detecting whether an interface or a port of a server, a power shelf, or a rack busbar has current leakage, including a first connector, a second connector, a connecting sheet group, and a current detector. The first connector and the second connector are different and configured to be connected to different interfaces or ports of the server, the power shelf, or the rack busbar. The connecting sheet group is connected between the first connector and the second connector, and configured to conduct a current of the first connector and the second connector. The current detector is arranged between the first connector and the second connector, the connecting sheet group pass through the current detector, the current detector is configured to detect the current conducted by the connecting sheet group.

15 Claims, 5 Drawing Sheets

100

CURRENT DETECTION DEVICE

CROSS-REFERENCE TO RELATED APPLICATIONS

This application claims priority to Chinese Patent Application No. 202411449707.0 filed on Oct. 17, 2024, in China National Intellectual Property Administration, the contents of which are incorporated by reference herein.

FIELD

The subject matter herein generally relates to server technology field, and more particularly to a current detection device.

BACKGROUND

In areas where servers are concentrated, such as server racks or computer rooms, due to the large number of servers and their high placement density, when it is necessary to detect some or all of the servers, such as detecting whether the server interfaces or ports have a current leakage, it is usually difficult to perform easily and quickly detections of the large number of densely distributed server interfaces or ports. The detection operations may be difficult and time consuming.

BRIEF DESCRIPTION OF THE DRAWINGS

Implementations of the present disclosure will now be described, by way of embodiments, with reference to the attached figures.

DETAILED DESCRIPTION

Figure 1:
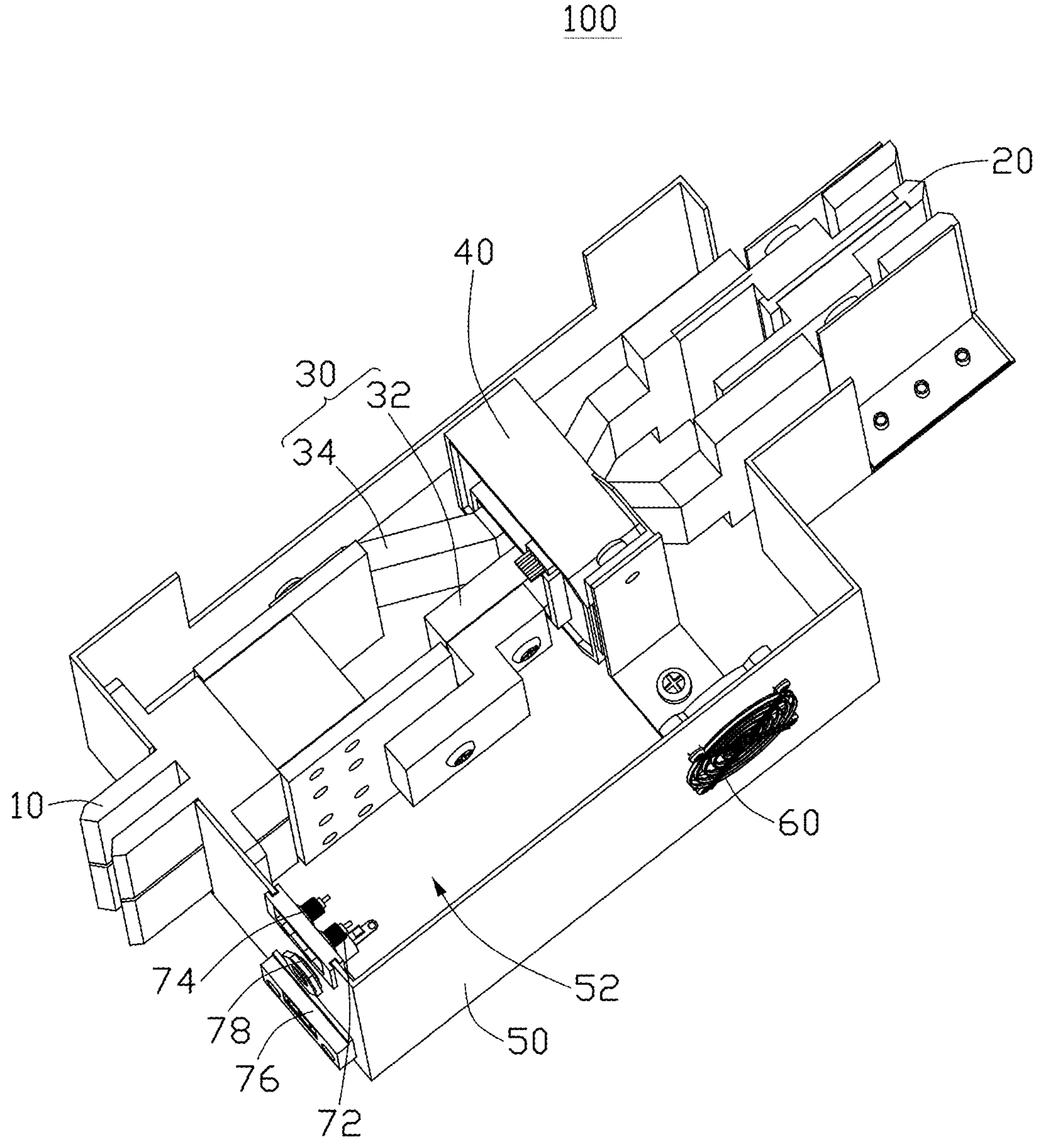
FIG. 1 is a structural diagram of a current detection device according to an embodiment of the present application.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

In some areas where servers are concentrated, such as server racks or computer rooms, due to the large number of servers and their high placement density, when it is necessary to detect some or all of the servers, such as detecting whether the server interfaces or ports have current leakage, it is usually difficult to perform convenient and quick detection of the large number of densely distributed server interfaces or ports, resulting in inconvenient and inefficient detection operations. Therefore, it is necessary to design a current detection device that can realize convenient and efficient detection of the servers.

FIG. 1 is a structural diagram of a current detection device according to an embodiment of the present application. The current detection device 100 is configured to detect whether interfaces or ports of servers, power shelves, and rack busbars have current leakage. The current detection device 100 includes a first connector 10, a second connector 20, a connecting sheet group 30, a current detector 40, and a housing 50. The first connector 10, the second connector 20, the connecting sheet group 30, and the current detector 40 are received in the housing 50.

The first connector 10 is arranged at one end of the housing 50, and configured to connect to an interface or a port of a server or a power shelf. In some embodiments, a plurality of servers can be placed in a server rack or cabinet to facilitate centralized storage and management of the servers. The power shelf can be a power supply unit (PSU) of the server, which is used in the server cabinet to provide power distribution and management for the server.

The second connector 20 is arranged at another end of the housing 50, and configured to connect to an interface or a port of a rack busbar. In some embodiments, the first connector 10 and the second connector 20 may be interfaces or ports with different specifications or models, which can be adapted to different interface types or port types. In some embodiments, the second connector 20 may be, but is not limited to, a terminal block or a terminal connector, such as a clip connector. In some embodiments, in a server cabinet, a rack busbar (or busbar) may be disposed at the back of the cabinet to transmit power and signals to each server node. The interfaces of the server, power shelf, and rack busbar may be of the same or different specifications or models, the first connector 10 and the second connector 20 may be of the same or different specifications or models, and may be adapted to the interface types or port types of the server, power shelf, and rack busbar.

The connecting sheet group 30 is connected between the first connector 10 and the second connector 20. The connecting sheet group 30 is configured to conduct current of the first connector 10 or the second connector 20. In some embodiments, when the first connector 10 or the second connector 20 feeds in current, the connecting sheet group 30 may conduct the current fed in by the first connector 10 or the second connector 20.

Figure 2:
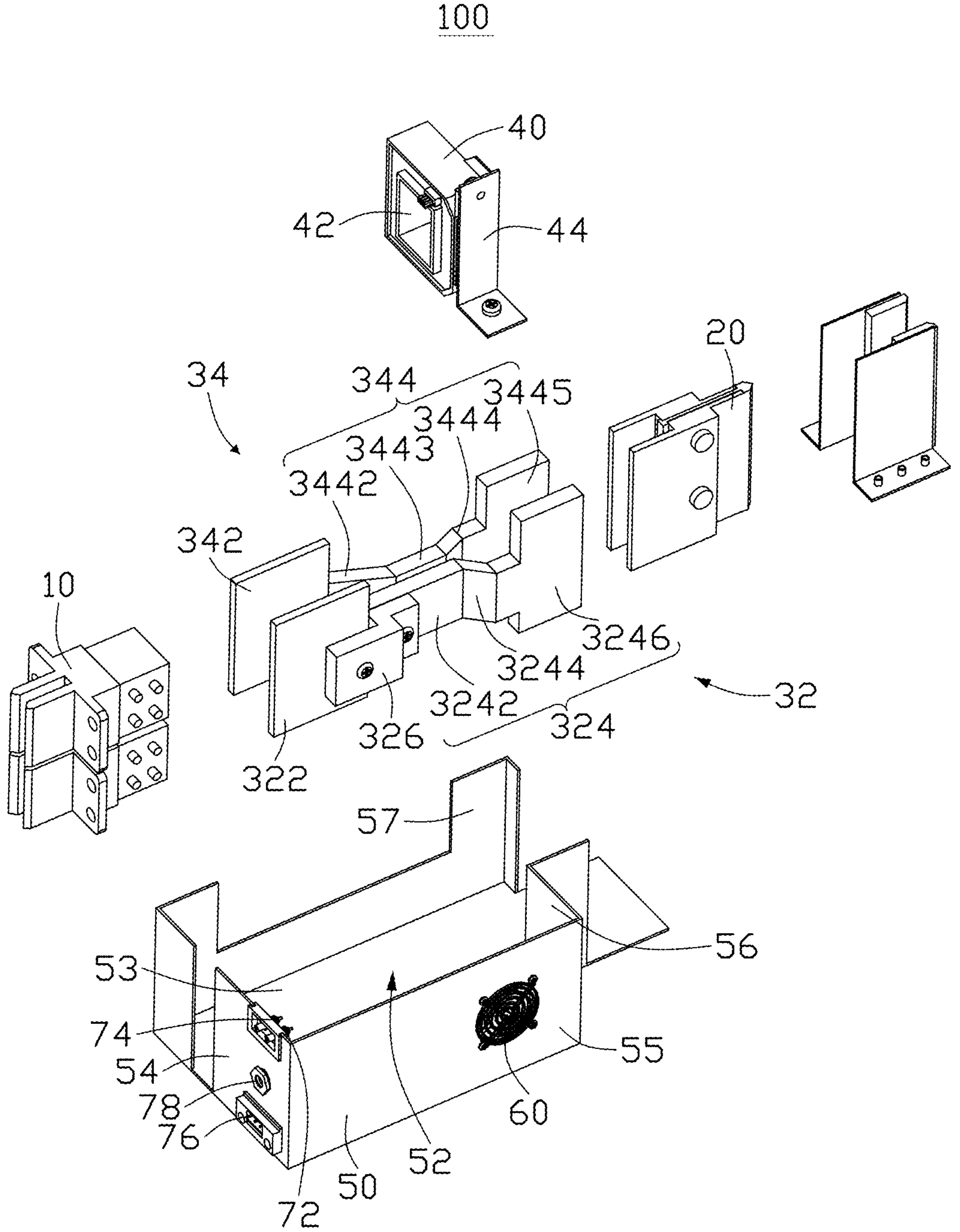
FIG. 2 is an explored view of the current detection device of FIG. 1.

Referring to FIGS. 1 and 2, the connecting sheet group 30 may include a positive electrode connecting sheet 32 and a negative electrode connecting sheet 34. The positive electrode connecting sheet 32 and the negative electrode connecting sheet 34 are arranged at intervals. One end of the positive electrode connecting sheet 32 is connected to the first connector 10, another end of the positive electrode connecting sheet 32 is connected to the second connector 20, and a middle portion of the positive electrode connecting sheet 32 passes through the current detector 40. One end of the negative electrode connecting sheet 34 is connected to the first connector 10 and correspondingly spaced apart from one end of the positive electrode connecting sheet 32, another end of the negative electrode connecting sheet 34 is connected to the second connector 20 and correspondingly spaced apart from another end of the positive electrode connecting sheet 32, and a middle portion of the negative electrode connecting sheet 34 passes through the current detector 40 and correspondingly spaced apart from the middle portion of the positive electrode connecting sheet 32. In some embodiments, the positive electrode connecting sheet 32 and the negative electrode connecting sheet 34 may be connected to positive electrodes and negative electrodes of the first connector 10 and the second connector 20, respectively.

Figure 3:
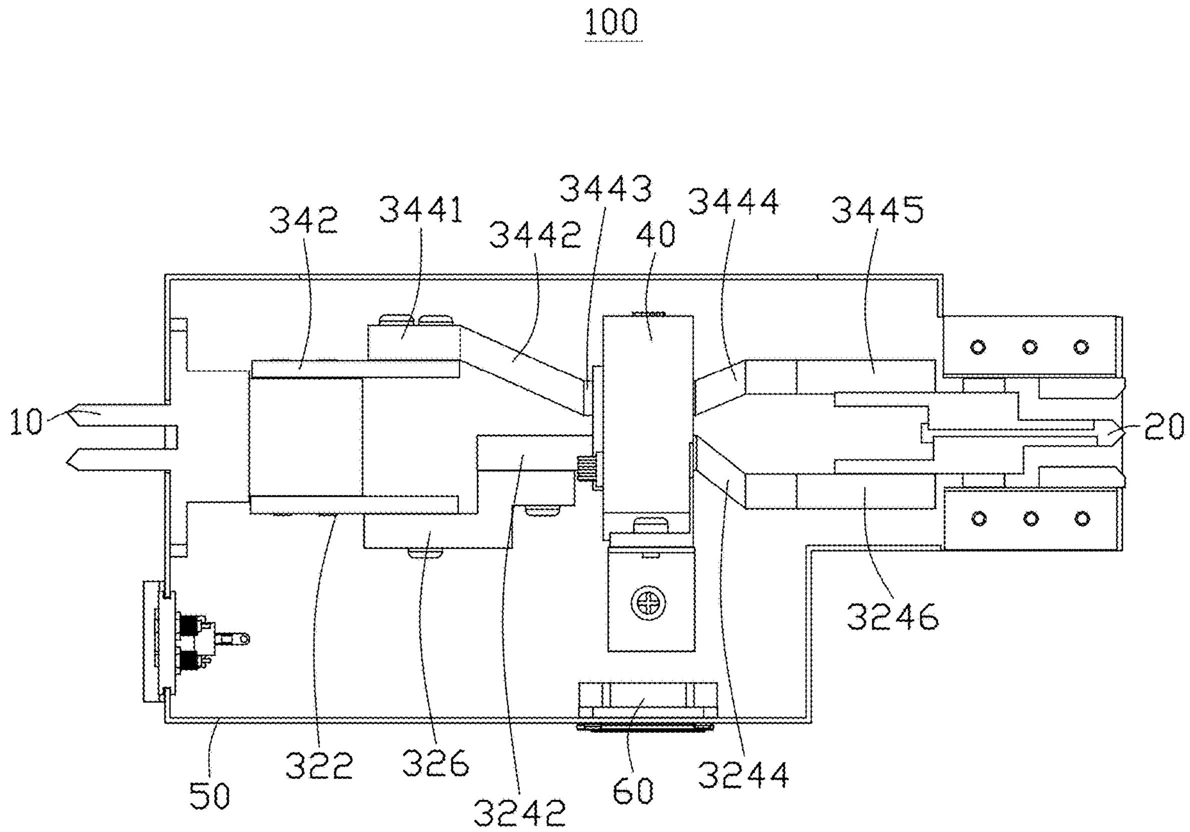
FIG. 3 is a top view of the current detection device of FIG. 1.

Referring to FIGS. 1, 2, and 3, the positive electrode connecting sheet 32 includes a first connecting portion 322, a second connecting portion 324, and a bridge portion 326. The first connecting portion 322 is connected to the first connector 10. The second connecting portion 324 includes a first section 3242, a second section 3244, and a third section 3246 connected in sequence. The first section 3242 and the third section 3246 are substantially arranged in parallel, the second section 3244 is obliquely connected between the first section 3242 and the third section 3246, so that the first section 3242 and the third section 3246 are non-collinear and create a certain amount of offset space. The first section 3242 is connected to the first connecting portion 322 through the bridge portion 326. In some embodiments, the bridge portion 326 is substantially in a stepped shape, opposite ends of the bridge portion 326 are respectively connected to the first section 3242 and the first connecting portion 322, so that the first section 3242 and the first connecting portion 322 may create a certain amount of offset space. The third section 3246 is connected to the second connector 20. In some embodiments, the bridge portion 326 can be respectively secured to the first section 3242 and the first connecting portion 322 through fasteners, which can be, but are not limited to, screws.

The negative electrode connecting sheet 34 includes a third connecting portion 342 and a fourth connecting portion 344. The third connecting portion 342 is connected to the first connector 10. The third connecting portion 342 and the first connecting portion 322 are spaced apart from each other by a first spacing distance. In some embodiments, the first connecting portion 322 and the third connecting portion 342 are arranged on two sides of the first connector 10, the first spacing distance may be a width of the first connector 10. The fourth connecting portion 344 includes a fourth section 3441, a fifth section 3442, a sixth section 3443, a seventh section 3444, and an eighth section 3445 connected in sequence. The fourth section 3441, the sixth section 3443, and the eighth section 3445 are substantially arranged in parallel, the fifth section 3442 is obliquely connected between the fourth section 3441 and the sixth section 3443, the seventh section 3444 is obliquely connected between the sixth section 3443 and the eighth section 3445, so that the fourth section 3441, the sixth section 3443, and the eighth section 3445 are non-collinear and create a certain amount of offset space. The fourth section 3441 is connected to the third connecting portion 342. The sixth section 3443 and the first section 3242 are spaced apart from each other with a second spacing distance, the sixth section 3443 and the first section 3242 pass through the current detector 40. The eighth section 3445 is connected to the second connector 20, the eighth section 3445 and the third section 3246 are spaced apart from each other with a third spacing distance. In some embodiments, the eighth section 3445 and the third section 3246 are arranged on two sides of the second connector 20, the third spacing distance may be a width of the second connector 20. In some embodiments, the second spacing distance is less than the third spacing distance, the third spacing distance is less than the first spacing distance, that is, the position between the sixth section 3443 and the first section 3242 is the position where the distance between the positive electrode connecting sheet 32 and the negative electrode connecting sheet 34 is the smallest, so that the sixth section 3443 and the first section 3242 can conveniently pass through the current detector 40 to reduce a volume of the current detector 40. In some embodiments, the third connecting portion 342 and the fourth section 3441 may be secured by fasteners, which can be, but are not limited to, screws.

The current detector 40 is arranged between the first connector 10 and the second connector 20, the connecting sheet group 30 pass through the current detector 40, the current detector 40 is configured to detect the current conducted by the connecting sheet group 30. In some embodiments, when the first connector 10 or the second connector 20 feeds in current, the connecting sheet group 30 may conduct the current fed in by the first connector 10 or the second connector 20, the current detector 40 may detect the current conducted by the connecting sheet group 30. In some embodiments, the current detector 40 may be, but is not limited to, a hall current sensor.

A middle portion of the current detector 40 defines a hole 42, the connecting sheet group 30 passes through the hole 42. In some embodiments, the hole 42 may be a detection area of the current detector 40, the positive electrode connecting sheet 32 and the negative electrode connecting sheet 34 pass through the hole 42 and spaced apart from each other, the current detector 40 may detect the current conducted by the positive electrode connecting sheet 32 and the negative electrode connecting sheet 34. In detail, the first section 3242 of the positive electrode connecting sheet 32 and the sixth section 3443 of the negative electrode connecting sheet 34 correspondingly pass through the hole 42.

The housing 50 is substantially in the shape of a hollow case or a hollow box, a receiving space 52 is provided inside the housing 50. The first connector 10, the second connector 20, the connecting sheet group 30, and the current detector 40 are received in the receiving space 52, the first connector 10 and the second connector 20 extend out of the housing 50 respectively.

The housing 50 includes a bottom board 53, a first side board 54, a second side board 55, a third side board 56, and a fourth side board 57. The bottom board 53, the first side board 54, the second side board 55, the third side board 56, and the fourth side board 57 enclose to form the receiving space 52. The first side board 54, the second side board 55, the third side board 56, and the fourth side board 57 are connected in sequence. The first side board 54 and the third side board 56 are arranged opposite to each other, the second side board 55 and the fourth side board 57 are arranged opposite to each other. The first connector 10 passes through the first side board 54 from the receiving space 52 to extend out of the housing 50, the second connector 20 passes through the third side board 56 from the receiving space 52 to extend out of the housing 50.

The current detection device 100 further includes a fixing bracket 44. The fixing bracket 44 is disposed on one side of the current detector 40. In some embodiments, one end of the fixing bracket 44 is fixedly connected to one side of the current detector 40, and another end of the fixing bracket 44 is connected to the bottom board 53, so that the fixing bracket 44 can fix the current detector 40 to the housing 50.

The current detection device 100 further includes a heat dissipater 60. The heat dissipater 60 is arranged in the second side board 55 and opposite to the current detector 40. The heat dissipater 60 is configured to dissipate heat from the current detector 40. In some embodiments, the heat dissipater 60 may be, but is not limited to, a fan.

Figure 4:
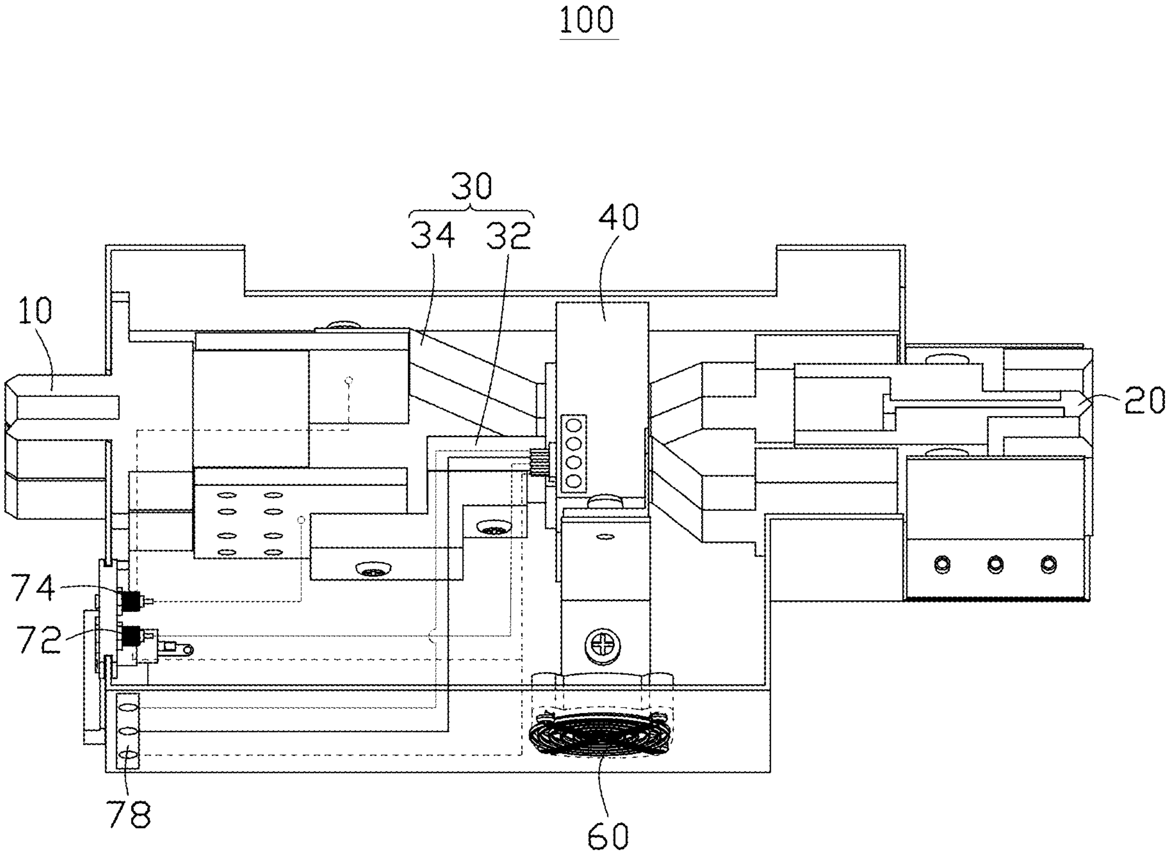
FIG. 4 is a schematic diagram of an electrical connection of the current detection device according to an embodiment of the present application.
Figure 5:
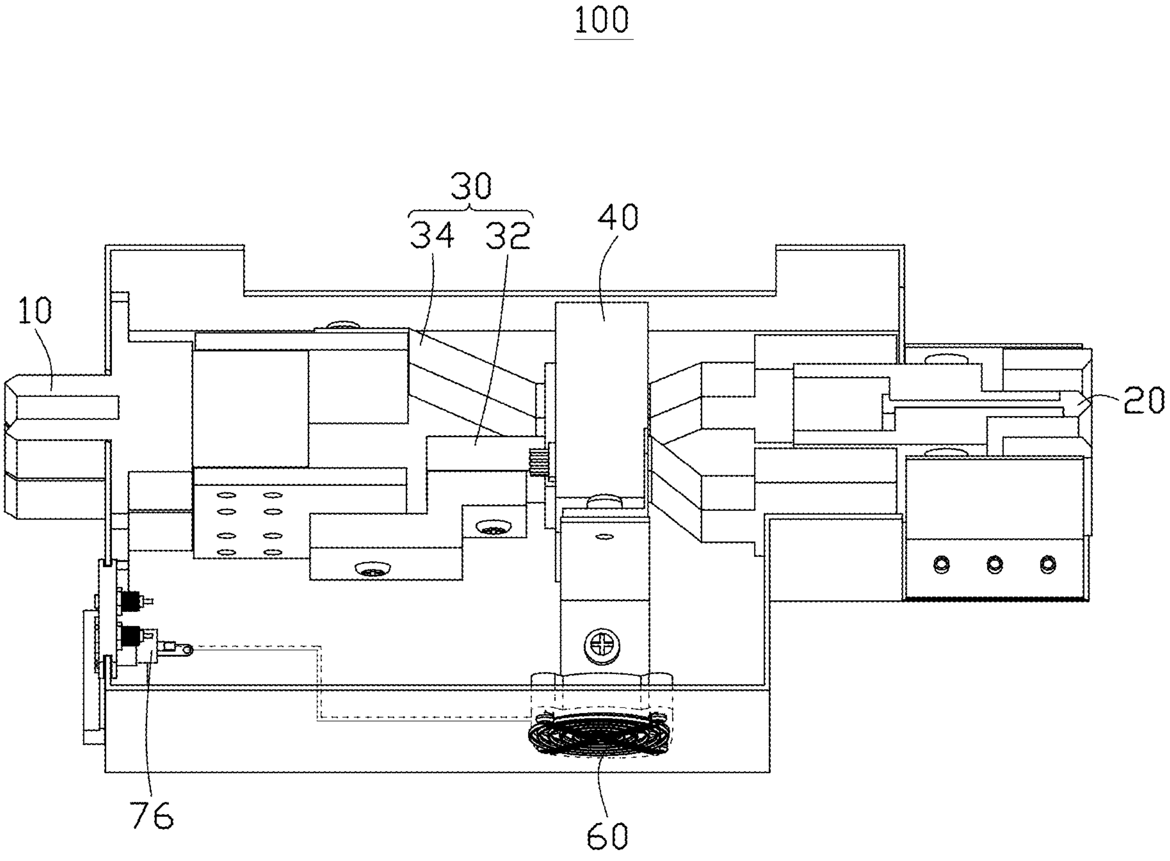
FIG. 5 is another schematic diagram of the electrical connection of the current detection device according to an embodiment of the present application.

Referring to FIGS. 1, 2, and 4, the current detection device 100 further includes a first signal interface 72 and a second signal interface 74. The first signal interface 72 and the second signal interface 74 may be arranged in the first side board 54. The first signal interface 72 is electrically connected to the current detector 40 for obtaining current signals of the current detector 40. The second signal interface 74 is electrically connected to the positive electrode connecting sheet 32 and the negative electrode connecting sheet 34 respectively for obtaining voltage signals of the positive electrode connecting sheet 32 and the negative electrode connecting sheet 34. In some embodiments, the first signal interface 72 and the second signal interface 74 can be connected to an external display, such as an oscilloscope, the first signal interface 72 and the second signal interface 74 can transmit the current signals of the current detector 40 and/or the voltage signals of the positive electrode connection piece 32 and the negative electrode connection piece 34 to the oscilloscope to display waveforms of the current signals and/or the voltage signals, so that the user can observe the current signals and/or the voltage signals more intuitively. In some embodiments, the first signal interface 72 and the second signal interface 74 can be, but are not limited to, SMB connectors.

Referring to FIGS. 1, 2, 4, and 5, the current detection device 100 further includes a first power interface 76 and a second power interface 78. The first power interface 76 and the second power interface 78 may be arranged in the first side board 54. The first power interface 76 is electrically connected to the current detector 40. The first power interface 76 can be connected to an external power source for providing electric power for the current detector 40. The second power interface 78 is electrically connected to the heat dissipater 60. The second power interface 78 can be connected to an external power source for providing electric power for the heat dissipater 60.

When the user or the operator uses the current detection device 100 to detect whether the interface or the port of the server, the power shelf, or the rack bus has current leakage, the operator connects to the interface or the port of the server, the power shelf, or the rack bus through the first connector 10 or the second connector 20. When the interface or the port connected to the first connector 10 or the second connector 20 has current or current leakage, the first connector 10 or the second connector 20 can conduct current to the positive electrode connecting sheet 32 and the negative electrode connecting sheet 34, the positive electrode connecting sheet 32 and the negative electrode connecting sheet 34 pass through the current detector 40, the current detector 40 can detect the current conducted on the positive electrode connecting sheet 32 and the negative electrode connecting sheet 34, and output the current signals to the first signal interface 72, the second signal interface 74 can obtain the voltage signals of the positive electrode connecting sheet 32 and the negative electrode connecting sheet 34. The first signal interface 72 and the second signal interface 74 output the current signals and the voltage signals to the external oscilloscope to display, providing the operator to observe the current leakage situations of the interface or the port of the server, the power shelf, or the rack bus.

The current detection device 100 is adaptively connected to the interface or the port of the server, the power shelf, or the rack bus through the first connector 10 or the second connector 20 of different specifications or models, so as to conveniently and quickly detect whether there is current or current leakage in the interface or the port, which is conducive to improving the detection efficiency of more servers or server cabinets.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure, up to and including the full extent established by the broad general meaning of the terms used in the claims.

What is claimed is:

1. A current detection device configured to detect whether an interface or a port of a server, a power shelf, or a rack busbar has a current leakage, the current detection device comprising:

a first connector;

a second connector, the first connector and the second connector being different and configured to be respectively connected to different interfaces or ports of the server, the power shelf, or the rack busbar;

a connecting sheet group connected between the first connector and the second connector, and configured to conduct a current of the first connector and the second connector; and a current detector arranged between the first connector and the second connector, the connecting sheet group passing through the current detector, the current detector configured to detect the current conducted by the connecting sheet group;

wherein the connecting sheet group comprises a positive electrode connecting sheet and a negative electrode connecting sheet, the positive electrode connecting sheet and the negative electrode connecting sheet are spaced apart from each other, the positive electrode connecting sheet comprises a first connecting portion, a second connecting portion, and a bridge portion; the first connecting portion is connected to the first connector, the second connecting portion is connected to the second connector, the bridge portion is in a stepped shape, opposite ends of the bridge portion are respectively connected to the first connecting portion and the second connecting portion, so that the first connecting portion and the second connecting portion create an offset space.

2. The current detection device of claim 1, wherein one end of the positive electrode connecting sheet is connected to the first connector, another end of the positive electrode connecting sheet is connected to the second connector, and a middle portion of the positive electrode connecting sheet passes through the current detector;

one end of the negative electrode connecting sheet is connected to the first connector and correspondingly spaced apart from the one end of the positive electrode connecting sheet, another end of the negative electrode connecting sheet is connected to the second connector and correspondingly spaced apart from the other end of the positive electrode connecting sheet, and a middle portion of the negative electrode connecting sheet passes through the current detector and correspondingly spaced apart from the middle portion of the positive electrode connecting sheet.

3. The current detection device of claim 2, wherein the positive electrode connecting sheet and the negative electrode connecting sheet are connected to positive electrodes and negative electrodes of the first connector and the second connector, respectively.

4. The current detection device of claim 2, wherein the second connecting portion comprises a first section, a second section, and a third section connected in sequence, the first section and the third section are arranged in parallel, the second section is obliquely connected between the first section and the third section, so that the first section and the third section are non-collinear and create a certain amount of offset space, the first section is connected to the first connecting portion through the bridge portion, the first section and the first connecting portion create the offset space; the third section is connected to the second connector.

5. The current detection device of claim 4, wherein the negative electrode connecting sheet comprises a third connecting portion and a fourth connecting portion, the third connecting portion is connected to the first connector, the third connecting portion and the first connecting portion are spaced apart from each other by a first spacing distance, the first connecting portion and the third connecting portion are arranged on two sides of the first connector; the fourth connecting portion is connected to the second connector.

6. The current detection device of claim 5, wherein the fourth connecting portion comprises a fourth section, a fifth section, a sixth section, a seventh section, and an eighth section connected in sequence; the fourth section, the sixth section, and the eighth section are arranged in parallel, the fifth section is obliquely connected between the fourth section and the sixth section, the seventh section is obliquely connected between the sixth section and the eighth section; the fourth section is connected to the third connecting portion; the sixth section and the first section pass through the current detector; the eighth section is connected to the second connector, the eighth section and the third section are arranged on two sides of the second connector.

7. The current detection device of claim 6, wherein the sixth section and the first section are spaced apart from each other with a second spacing distance, the eighth section and the third section are spaced apart from each other with a third spacing distance; the second spacing distance is less than the third spacing distance, the third spacing distance is less than the first spacing distance.

8. The current detection device of claim 1, wherein a middle portion of the current detector defines a hole, the connecting sheet group passes through the hole.

9. The current detection device of claim 2, wherein a middle portion of the current detector defines a hole, the positive electrode connecting sheet and the negative electrode connecting sheet pass through the hole and spaced apart from each other, the current detector detects the current conducted by the positive electrode connecting sheet and the negative electrode connecting sheet at the hole area.

10. The current detection device of claim 1, further comprising a housing, wherein the housing defines a receiving space; the first connector, the second connector, the connecting sheet group, and the current detector are received in the receiving space, the first connector and the second connector extend out of the housing respectively.

11. The current detection device of claim 10, wherein the housing comprises a bottom board, a first side board, a second side board, a third side board, and a fourth side board; the bottom board, the first side board, the second side board, the third side board, and the fourth side board enclose to form the receiving space; the first side board, the second side board, the third side board, and the fourth side board are connected in sequence; the first side board and the third side board are arranged opposite to each other, the second side board and the fourth side board are arranged opposite to each other; the first connector passes through the first side board from the receiving space to extend out of the housing, the second connector passes through the third side board from the receiving space to extend out of the housing.

12. The current detection device of claim 10, further comprising a fixing bracket, wherein one end of the fixing bracket is fixedly connected to one side of the current detector, and another end of the fixing bracket is connected to the housing, so that the fixing bracket fixes the current detector to the housing.

13. The current detection device of claim 10, further comprising a heat dissipater, wherein heat dissipater is arranged on the housing and opposite to the current detector, the heat dissipater is configured to dissipate heat from the current detector.

14. The current detection device of claim 13, further comprising a first power interface and a second power interface, wherein the first power interface and the second power interface are arranged on the housing, the first power interface is electrically connected to the current detector for providing electric power for the current detector; the second power interface is electrically connected to the heat dissipater for providing electric power for the heat dissipater.

15. The current detection device of claim 10, further comprising a first signal interface and a second signal interface, wherein the first signal interface and the second signal interface are arranged on the housing, the first signal interface is electrically connected to the current detector for obtaining current signals of the current detector; the second signal interface is electrically connected to the connecting sheet group for obtaining voltage signals of the connecting sheet group.

* * * * *